(12) United States Patent
Rowell et al.

(10) Patent No.: US 10,523,801 B1
(45) Date of Patent: Dec. 31, 2019

(54) OVER-THE-AIR MEASUREMENT CHAMBER AND OVER-THE-AIR MEASUREMENT METHOD

(71) Applicant: Rohde & Schwarz GmbH & Co. KG, Munich (DE)

(72) Inventors: Corbett Rowell, Munich (DE); Stefan Ullrich, Tutzing (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/188,653

(22) Filed: Nov. 13, 2018

(30) Foreign Application Priority Data

Oct. 26, 2018 (EP) ..................................... 18202760

(51) Int. Cl.
| | |
|---|---|
| *H04B 17/00* | (2015.01) |
| *H04M 1/24* | (2006.01) |
| *H05K 5/00* | (2006.01) |
| *H05K 7/20* | (2006.01) |
| *H05K 5/06* | (2006.01) |
| *H04W 24/06* | (2009.01) |

(52) U.S. Cl.
CPC ............ *H04M 1/24* (2013.01); *H05K 5/0095* (2013.01); *H05K 5/069* (2013.01); *H05K 7/20136* (2013.01); *H04W 24/06* (2013.01)

(58) Field of Classification Search
CPC ......... H04B 17/00; H04B 17/29; H04M 1/24; H03M 3/22; H04W 24/00
See application file for complete search history.

(56) References Cited

U.S. PATENT DOCUMENTS

| | | | |
|---|---|---|---|
| 9,116,232 B2 * | 8/2015 | Goel .................... | H04B 17/318 |
| 2018/0321292 A1 * | 11/2018 | Bartko ............... | G01R 29/0821 |
| 2018/0340975 A1 * | 11/2018 | Herbrig .............. | G01R 29/0821 |

FOREIGN PATENT DOCUMENTS

EP          3035730 B1      6/2016

\* cited by examiner

*Primary Examiner* — Tuan Pham
(74) *Attorney, Agent, or Firm* — Potomac Technology Law, LLC

(57) ABSTRACT

An over-the-air measurement chamber is provided for performing measurements with respect to a device under test. The over-the-air measurement chamber includes a thermally isolated space inside the over-the-air measurement chamber, a positioner for positioning the device under test, and a first gas guiding means for intake of a gas and a second gas guiding means for outtake of the gas. The positioner comprises an inner portion and an outer rotational unit. The first and second gas guiding means are fed into the inner portion of the positioner through a hollow rotational axis of the outer rotational unit.

15 Claims, 2 Drawing Sheets

OVER-THE-AIR MEASUREMENT CHAMBER AND OVER-THE-AIR MEASUREMENT METHOD

RELATED APPLICATIONS

This application claims priority from European Patent Application No. EP18202760.7 (filed 2018 Oct. 26), the entirety of which is incorporated by reference herein.

TECHNICAL FIELD

The invention relates to an over-the-air measurement chamber for performing measurements, especially measurements regarding wireless connectivity capabilities under different temperature conditions, with respect to a device under test and a corresponding over-the-air measurement method.

BACKGROUND

Generally, in times of an increasing number of communication applications providing wireless connectivity capabilities, there is a growing need of an over-the-air measurement chamber and an over-the-air measurement method for performing measurements with respect to such applications in order to verify their correct functioning especially under different temperature conditions.

EP3035730B1 relates to a measurement housing adapted to receive at least one mobile communication device for measurement of a wireless communication of said mobile communication device, wherein said measurement housing is transparent to high frequency signals and comprises a temperature control unit adapted to control an internal temperature within said measurement housing. However, in accordance with said document, the mobile communication device cannot be positioned in a flexible manner during measuring, which disadvantageously leads to a limited accuracy and a reduced efficiency of the respective measurement.

Accordingly, there is a need to provide an over-the-air measurement chamber and an over-the-air measurement method in order to allow for performing measurements, especially measurements regarding wireless connectivity capabilities under different temperature conditions, with respect to a device under test in a flexible manner, thereby ensuring a high accuracy and efficiency of the measurement.

SOME EXAMPLE EMBODIMENTS

Embodiments of the present invention advantageously address the foregoing requirements and needs, as well as others, by providing an over-the-air measurement chamber and an over-the-air measurement method in order to allow for performing measurements, especially measurements regarding wireless connectivity capabilities under different temperature conditions, with respect to a device under test in a flexible manner, thereby ensuring a high accuracy and efficiency of the measurement.

According to a first aspect of the invention, an over-the-air measurement chamber for performing measurements with respect to a device under test is provided. The over-the-air measurement chamber comprises a thermally isolated space inside the over-the-air measurement chamber, a positioner for positioning the device under test, wherein the positioner comprises an inner portion and an outer rotational unit, and two gas guiding means for gas intake and gas out-take. In this context, the two gas guiding means are fed into the inner portion of the positioner through a hollow rotational axis of the outer rotational unit. Advantageously, in this manner, measurements regarding wireless connectivity capabilities can be performed under different temperature conditions in a flexible manner, thereby ensuring a high accuracy and efficiency of the measurement.

According to a first preferred implementation form of the first aspect of the invention, the thermally isolated space surrounds the device under test. In addition to this or as an alternative, the inner portion comprises the thermally isolated space. Advantageously, for instance, complexity can be reduced, thereby increasing measurement efficiency.

According to a second preferred implementation form of the first aspect of the invention, the thermally isolated space is of spherical or ellipsoidal shape. Additionally or alternatively, the thermally isolated space is a thermally isolated bubble or a kind thereof. Advantageously, for example, complexity can further be reduced, which leads to a further increased measurement efficiency.

According to a further preferred implementation form of the first aspect of the invention, the thermally isolated space is formed by a radio frequency neutral material. In addition to this or as an alternative, the thermally isolated space comprises a radio frequency neutral upper dome. Advantageously, for example, distorted measurement results can be avoided, thereby ensuring a high accuracy.

According to a further preferred implementation form of the first aspect of the invention, the inner portion of the positioner comprises an inner rotational axis. In this context, the inner rotational axis is configured to rotatably hold the device under test. Advantageously, for instance, complexity can further be reduced, thereby ensuring an increased measurement efficiency. Further advantageously, the inner rotational axis may especially be independently rotatable from the inner portion. Additionally, it is noted that a rubber ring may preferably allow the inner rotational axis to rotate independently from the inner portion of the positioner.

According to a further preferred implementation form of the first aspect of the invention, the hollow rotational axis is independently rotatable from the inner rotational axis. Advantageously, in this manner, flexibility, and thus also measurement efficiency, can further be increased.

According to a further preferred implementation form of the first aspect of the invention, the hollow rotational axis and the inner rotational axis form an angle between 5 and 90 degrees, preferably between 45 and 90 degrees, more preferably between 60 and 90 degrees, most preferably between 80 and 90 degrees. Advantageously, flexibility can further be increased, which leads to an increased measurement efficiency.

According to a further preferred implementation form of the first aspect of the invention, the gas guided by the two gas guiding means comprises heated gas or cooled gas. Additionally or alternatively, the gas guided by the two gas guiding means comprises at least one of air, nitrogen, or sulfur hexafluoride. Advantageously, for instance, flexibility can further be increased, thereby especially ensuring an increased measurement efficiency.

According to a further preferred implementation form of the first aspect of the invention, at least one of the two gas guiding means comprises at least one of a hose, a pipe, a corrugated pipe, a bellows-based hose, or a bellows-based pipe. Advantageously, for example, not only complexity can be reduced but also flexibility can be increased, which leads to an increased measurement efficiency.

According to a further preferred implementation form of the first aspect of the invention, each of the two gas guiding means fed into the inner portion comprises a rotary joint which is configured for compressed gas type applications such that the hollow rotational axis is independently rotatable of corresponding stationary gas guiding means being outside the outer rotational unit. Additionally or alternatively, the two gas guiding means fed into the inner portion are rotatable with the outer rotational unit. Advantageously, for instance, gas can efficiently be guided without loss.

According to a further preferred implementation form of the first aspect of the invention, the two gas guiding means fed into the inner portion are connected to the thermally isolated space. Advantageously, for example, gas can efficiently be guided into the thermally isolated space.

According to a further preferred implementation form of the first aspect of the invention, the inner portion of the positioner is rotatable around the hollow rotational axis. In addition to this or as an alternative, the outer rotational unit is rotatable around the hollow rotational axis. Advantageously, complexity can be further reduced, thereby ensuring an increased measurement efficiency.

According to a further preferred implementation form of the first aspect of the invention, the positioner further comprises a stationary base. In this context, the stationary base is configured to rotatably hold the hollow rotational axis. In addition to this or as an alternative, the stationary base is configured to rotatably hold the inner portion. Further additionally or further alternatively, the stationary base is configured to rotatably hold the outer rotation unit. Advantageously, for instance, the positioner allows for a secure stand, thereby avoiding positioning errors.

According to a further preferred implementation form of the first aspect of the invention, the over-the-air measurement chamber further comprises a feedthrough configured to get the two gas guiding means into and out of the over-the-air measurement chamber. Advantageously, it is not necessary to place any unit for gas intake and/or out-take—such as a heated or cooled air generation unit—inside the over-the-air measurement chamber. However, as an alternative, it is noted that said unit for gas intake and/or out-take, preferably in the form of a tempered air generation unit, may be placed inside the over-the-air measurement chamber. In other words, the over-the-air measurement chamber may further comprise a tempered air generation unit.

According to a second aspect of the invention, an over-the-air measurement method is provided. The over-the-air measurement method comprises the steps of placing a device under test into an over-the-air measurement chamber according to the first aspect of the invention or any preferred implementation form thereof, and performing at least one over-the-air measurement with respect to the device under test. Advantageously, in this manner, measurements regarding wireless connectivity capabilities can be performed under different temperature conditions in a flexible manner, thereby ensuring a high accuracy and efficiency of the measurement.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Exemplary embodiments of the invention are now further explained with regard to the drawings by way of example only and not for limitation. In the drawings

DETAILED DESCRIPTION

An over-the-air measurement chamber and an over-the-air measurement method in order to allow for performing measurements, especially measurements regarding wireless connectivity capabilities under different temperature conditions, with respect to a device under test in a flexible manner, thereby ensuring a high accuracy and efficiency of the measurement, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

Figure 1:
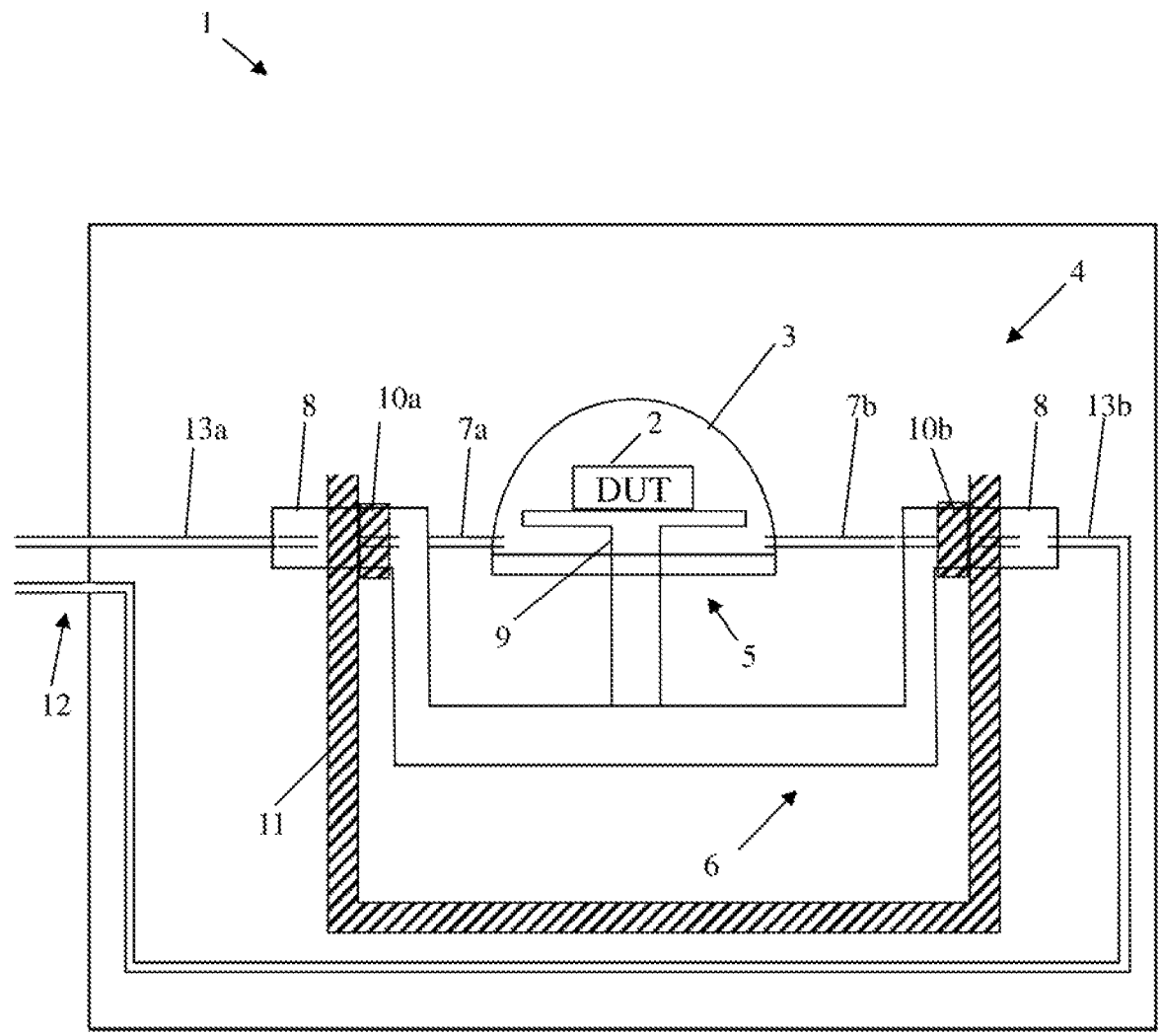
FIG. 1 shows an exemplary embodiment of an inventive over-the-air measurement chamber.

With respect to FIG. 1, a block diagram of an exemplary embodiment of an over-the-air measurement chamber 1 for performing measurements with respect to a device under test 2 is shown.

According to FIG. 1, the over-the-air measurement chamber 1 comprises a thermally isolated space 3 inside the over-the-air measurement chamber 1, a positioner 4 for positioning the device under test 2, wherein the positioner 4 comprises an inner portion 5 and an outer rotational unit 6, and two gas guiding means 7a, 7b for gas intake and gas out-take. As it can be seen, the two gas guiding means 7a, 7b are fed into the inner portion 5 of the positioner 4 through a hollow rotational axis 8 of the outer rotational unit 6.

As it can further be seen from FIG. 1, the thermally isolated space 3 surrounds the device under test 2. In addition to this, the inner portion 5 comprises the thermally isolated space 3. In other words, the thermally isolated space 3 is attached to the inner portion 5.

Furthermore, in this exemplary case the thermally isolated space 3 is a thermally isolated bubble, which is formed by a radio frequency neutral material. Preferably, said thermally isolated bubble may be made from rohacell. According to FIG. 1, in other words, the thermally isolated bubble comprises a radio frequency neutral upper dome.

It is further noted that the thermally isolated space 3 or the thermally isolated bubble may especially be based on a double-walled design in order to allow for a high thermal insulation. In this context, the space between the respective walls of the double-walled design may preferably comprise air or a vacuum.

With respect to the over-the-air measurement chamber 1, it should generally be mentioned that the over-the-air measurement chamber 1 may optionally comprise a compact antenna test range (CATR) reflector. Preferably, said CATR reflector may be located inside the over-the-air measurement chamber and/or outside the thermally isolated space 3. In this context, it is noted that the CATR reflector is optional, since far-field conditions with special respect to the device under test 2 can be established in a direct manner especially without the reflector or in an indirect manner especially with the reflector.

Moreover, the inner portion 5 of the positioner 4 comprises an inner rotational axis 9. Said inner rotational axis 9 is configured to rotatably hold the device under test 2. Additionally, in this exemplary case, the inner rotational axis 9 is independently rotatable from the inner portion 5. In this context, it is noted that, for instance, a rubber ring may preferably allow the inner rotational axis 9 to rotate independently from the inner portion 5 of the positioner 4.

With respect to the gas guided by the two gas guiding means 7a, 7b, it is noted that said gas may especially comprises heated gas or cooled gas. It is further noted that additionally or alternatively, the gas guided by the two gas guiding means 7a, 7b may comprise at least one of air, nitrogen, or sulfur hexafluoride.

With respect to the gas guiding means 7a, 7b, it should be mentioned that at least one of the two gas guiding means 7a, 7b comprises at least one of a hose, a pipe, a corrugated pipe, a bellows-based hose, or a bellows-based pipe.

Furthermore, in accordance with FIG. 1, each of the two gas guiding means 7a, 7b fed into the inner portion 5 comprises a rotary joint 10a, 10b which is configured for compressed gas type applications such that the hollow rotational axis 8 is independently rotatable of corresponding stationary gas guiding means 13a, 13b being outside the outer rotational unit 6. In addition to this, the two gas guiding means 7a, 7b fed into the inner portion 5 are rotatable with the outer rotational unit 6.

In further addition to this, the two gas guiding means 7a, 7b fed into the inner portion 5 are connected to the thermally isolated space 3 or the thermally isolated bubble, respectively.

Moreover, in this exemplary case, as it can also be seen from FIG. 1, both the inner portion 5 of the positioner 4 and the outer rotational unit 6 are rotatable around the hollow rotational axis 8.

Additionally, the positioner 4 further comprises a stationary base 11. In this exemplary case according to FIG. 1, the stationary base is configured to rotatably hold each of the hollow rotational axis 8, the inner portion 5, and the outer rotation unit 6.

Furthermore, it should be mentioned that the hollow rotational axis 8 is independently rotatable from the inner rotational axis 9.

In addition to this or as an alternative, it is further noted that the hollow rotational axis 8 and the inner rotational axis 9 form an angle between 5 and 90 degrees, preferably between 45 and 90 degrees, more preferably between 60 and 90 degrees, most preferably between 80 and 90 degrees. Exemplarily, as it can be seen, the hollow rotational axis 8 is perpendicular to the inner rotational axis 9.

In addition to this, it should be mentioned that the over-the-air measurement chamber 1 further comprises a feedthrough 12 configured to get the two gas guiding means, especially the stationary gas guiding means 13a, 13b, into and out of the over-the-air measurement chamber 1.

Figure 2:
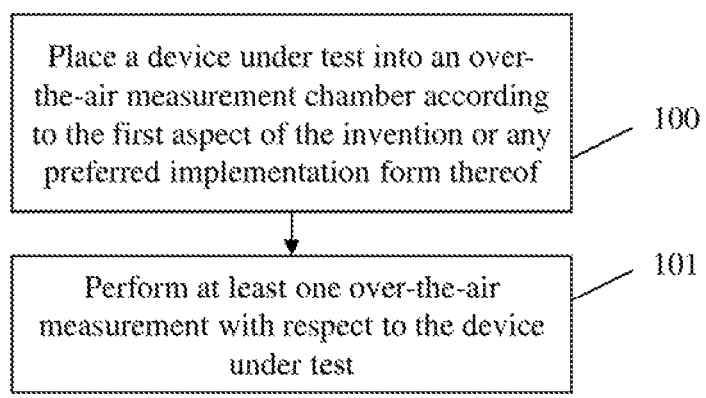
FIG. 2 shows a flow chart of an embodiment of the second aspect of the invention.

Finally, FIG. 2 shows a flow chart of an embodiment of the inventive method. In a first step S100, a device under test is placed into an over-the-air measurement chamber according to the first aspect of the invention or any preferred implementation form thereof. Then, in a second step S101, at least one over-the-air measurement is performed with respect to the device under test.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An over-the-air measurement chamber for performing measurements with respect to a device under test, the over-the-air measurement chamber comprising:
   a thermally isolated space inside the over-the-air measurement chamber;
   a positioner for positioning the device under test, wherein the positioner comprises an inner rotational unit and an outer rotational unit; and
   a first gas guiding means for intake of a gas and a second gas guiding means for outtake of the gas; and
   wherein the first and second gas guiding means are fed into the inner portion of the positioner through a hollow rotational axis of the outer rotational unit.

2. The over-the-air measurement chamber according to claim 1, wherein the thermally isolated space surrounds the device under test, and/or wherein the inner portion comprises the thermally isolated space.

3. The over-the-air measurement chamber according to claim 1, wherein the thermally isolated space is of spherical or ellipsoidal shape, and/or wherein the thermally isolated space is a thermally isolated bubble or a kind thereof.

4. The over-the-air measurement chamber according to claim 1, wherein the thermally isolated space is formed by a radio frequency neutral material, and/or wherein the thermally isolated space comprises a radio frequency neutral upper dome.

5. The over-the-air measurement chamber according to claim 1, wherein the inner portion of the positioner comprises an inner rotational axis, wherein the inner rotational axis is configured to rotatably hold the device under test.

6. The over-the-air measurement chamber according to claim 5, wherein the hollow rotational axis is independently rotatable from the inner rotational axis.

7. The over-the-air measurement chamber according to claim 5, wherein the hollow rotational axis and the inner rotational axis form an angle between 5 and 90 degrees.

8. The over-the-air measurement chamber according to claim 1, wherein the gas guided by the first and second gas guiding means comprises heated gas or cooled gas, and/or wherein the gas guided by the first and second gas guiding means comprises at least one of air, nitrogen or sulfur hexafluoride.

9. The over-the-air measurement chamber according to claim 1, wherein at least one of the first and second gas guiding means comprises at least one of a hose, a pipe, a corrugated pipe, a bellows-based hose, and a bellows-based pipe.

10. The over-the-air measurement chamber according to claim 1, wherein each of the first and second gas guiding means comprises a rotary joint that is configured for compressed gas type applications such that the hollow rotational axis is independently rotatable from a corresponding stationary gas guiding means located outside of the outer rotational unit, and/or wherein the first and second gas guiding means are rotatable with the outer rotational unit.

11. The over-the-air measurement chamber according to claim 1, wherein the first and second gas guiding means are connected to the thermally isolated space.

12. The over-the-air measurement chamber according to claim 1, wherein the inner portion of the positioner is rotatable around the hollow rotational axis, and/or wherein the outer rotational unit is rotatable around the hollow rotational axis.

13. The over-the-air measurement chamber according to claim 1, wherein the positioner further comprises:
   a stationary base, wherein the stationary base is configured to rotatably hold the hollow rotational axis, and/or wherein the stationary base is configured to rotatably hold the inner portion, and/or wherein the stationary base is configured to rotatably hold the outer rotation unit.

14. The over-the-air measurement chamber according to claim 1, further comprising:
   a feedthrough configured to allow the first and second gas guiding means to pass into and out of the over-the-air measurement chamber.

15. An over-the-air measurement method comprising the steps of:
   placing a device under test into an over-the-air measurement chamber that comprises a thermally isolated space inside the over-the-air measurement chamber, a positioner for positioning the device under test, and a first gas guiding means for intake of a gas and a second gas guiding means for outtake of the gas, wherein the positioner comprises an inner rotational unit and an outer rotational unit, and wherein the first and second gas guiding means are fed into the inner portion of the positioner through a hollow rotational axis of the outer rotational unit; and
   performing at least one over-the-air measurement with respect to the device under test.

* * * * *